(12) United States Patent
Wang et al.

(10) Patent No.: US 10,707,286 B2
(45) Date of Patent: Jul. 7, 2020

(54) OLED DEVICE AND A METHOD OF PREPARING THE SAME

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Qinghe Wang, Beijing (CN); Dongfang Wang, Beijing (CN); Tongshang Su, Beijing (CN); Rui Peng, Beijing (CN); Leilei Cheng, Beijing (CN); Yang Zhang, Beijing (CN); Jun Wang, Beijing (CN); Guangyao Li, Beijing (CN); Liangchen Yan, Beijing (CN); Guangcai Yuan, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/417,031

(22) Filed: May 20, 2019

(65) Prior Publication Data
US 2020/0058724 A1     Feb. 20, 2020

(30) Foreign Application Priority Data
Aug. 17, 2018   (CN) .......................... 2018 1 0945727

(51) Int. Cl.
*H01L 27/32* (2006.01)
*H01L 51/52* (2006.01)
(52) U.S. Cl.
CPC ...... *H01L 27/3262* (2013.01); *H01L 51/5218* (2013.01); *H01L 51/5234* (2013.01);
(Continued)

(58) Field of Classification Search
None
See application file for complete search history.

(56) References Cited

U.S. PATENT DOCUMENTS 7,642,124 B2   1/2010   Dimmler et al.
7,960,713 B2   6/2011   Hunt et al.
(Continued)

FOREIGN PATENT DOCUMENTS

CN   101449404 A   6/2009
CN   101933125 A   12/2010

OTHER PUBLICATIONS

First Office Action, including Search Report, for Chinese Patent Application No. 201810945727.5, dated Mar. 23, 2020, 12 pages.

*Primary Examiner* — Dung A. Le
(74) *Attorney, Agent, or Firm* — Westman, Champlin & Koehler, P.A.

(57) ABSTRACT

An OLED device and a method of preparing the same are provided, the OLED device including: a substrate; a first source electrode on the substrate, the first source electrode having a first side surface; a first insulating layer on the first source electrode, the first insulating layer having a second side surface intersecting with an upper surface of the first source electrode and the first side surface of the first source electrode, with at least one of an angle between the first side surface and the upper surface of the substrate and an angle between the second side surface and the upper surface of the substrate being an acute angle; an active layer on the substrate, the active layer covering the first side surface and the second side surface; a gate insulating layer on the active layer; an anode on the gate insulating layer; a light emitting functional layer on the anode; and a cathode on the light emitting functional layer, the cathode including a first drain region covering the first insulating layer and being in contact with the active layer.

18 Claims, 4 Drawing Sheets

(52) U.S. Cl.
CPC .. *H01L 2227/323* (2013.01); *H01L 2251/533* (2013.01); *H01L 2251/5315* (2013.01)

(56) References Cited

U.S. PATENT DOCUMENTS

| | | | |
|---|---|---|---|
| 8,455,897 B2* | 6/2013 | Ha | H01L 27/3276 257/79 |
| 2005/0218412 A1 | 10/2005 | Kido et al. | |
| 2007/0254402 A1 | 11/2007 | Dimmler et al. | |
| 2008/0220562 A1 | 9/2008 | Dimmler et al. | |
| 2009/0166686 A1 | 7/2009 | Hunt et al. | |
| 2012/0138902 A1 | 6/2012 | Hunt et al. | |
| 2016/0155854 A1* | 6/2016 | Yamazaki | H01L 29/1054 257/43 |
| 2019/0237508 A1* | 8/2019 | Choi | H01L 25/167 |

* cited by examiner

OLED DEVICE AND A METHOD OF PREPARING THE SAME

CROSS-REFERENCE TO RELATED APPLICATION

The present disclosure claims the benefit of Chinese Patent Application Invention No. 201810945727.5 filed on Aug. 17, 2018 in the State Intellectual Property Office of China, the whole disclosure of which is incorporated herein by reference.

BACKGROUND

Field

Embodiments of the present disclosure generally relate to the technical field of light emitting device, and in particular, to an OLED device and a method of preparing the same.

Description of the Related Art

In a technical field of display and illumination, OLED (Organic Light Emitting Device) technology is widely used.

However, in relevant display and illumination products based on OLED technology, an OLED device is typically in a form of a top-emission structure or a bottom-emission structure and thus may merely function as a plane light source, such that its applicable range may accordingly be limited to occasions where a plane light source type is applicable; and in a condition that a relevant OLED device operates at a fixed cathode voltage and a fixed anode voltage, its luminance is not adjustable.

SUMMARY

The embodiments of the present disclosure have been made to overcome or alleviate at least one aspect of the above mentioned disadvantages and/or shortcomings in the prior art, by providing an OLED device and a method of preparing the same, so as to solve a problem that a relevant OLED device has a relatively small applicable range.

Following technical solutions are adopted in exemplary embodiments of the invention.

According to one aspect of embodiments of the disclosure, there is provided an OLED device, comprising: a substrate; a first source electrode on a side of the substrate, the first source electrode having a first side surface intersecting with the substrate at a first angle; a first insulating layer on an upper surface of the first source electrode facing away from the substrate, the first insulating layer having a second side surface intersecting with the upper surface of the first source electrode at a second angle, and the second side surface also intersecting with the first side surface of the first source electrode; an active layer at a same side of the substrate as the first source electrode and the first insulating layer, the active layer covering the first side surface and the second side surface; a gate insulating layer on the active layer; an anode on the gate insulating layer; a light emitting functional layer on the anode; and a cathode on the light emitting functional layer, a portion of the cathode at least partially covering the first insulating layer and functioning as a first drain region which is in contact with the active layer; at least one of an angle between the first side surface and the upper surface of the substrate and an angle between the second side surface and the upper surface of the substrate is an acute angle.

According to an exemplary embodiment of the present disclosure, the OLED device further comprises: a second source electrode at a same side of the substrate as the first source electrode, the second source electrode and the first source electrode being in a same layer and spaced apart from each other, and the second source electrode having a third side surface opposite to the first side surface of the first source electrode, the third side surface intersecting with the substrate at a third angle; and a second insulating layer on an upper surface of the second source electrode facing away from the substrate, the second insulating layer and the first insulating layer being in a same layer and spaced apart from each other, and the second insulating layer having a fourth side surface opposite to the second side surface of the first insulating layer, the fourth side surface intersecting with the upper surface of the second source electrode at a fourth angle, and the fourth side surface also intersecting with the third side surface of the second source electrode; at least one of the angle between the third side surface and the upper surface of the substrate and the angle between the fourth side surface and the upper surface of the substrate is also an acute angle; the active layer covers the third side surface and the fourth side surface; and a portion of the cathode at least partially covers the second insulating layer and functions as a second drain region which is in contact with the active layer.

According to an exemplary embodiment of the present disclosure, each of the angle between the first side surface and the upper surface of the substrate and the angle between the second side surface and the upper surface of the substrate is an acute angle, and each of the angle between the third side surface and the upper surface of the substrate and the angle between the fourth side surface and the upper surface of the substrate is also an acute angle; the angle between the first side surface and the upper surface of the substrate and the angle between the third side surface and the upper surface of the substrate are the same as each other and equal to a first included angle value; and the angle between the second side surface and the upper surface of the substrate and the angle between the fourth side surface and the upper surface of the substrate are the same as each other and equal to a second included angle value.

According to an exemplary embodiment of the present disclosure, the gate insulating layer is spaced apart from and thus in contact with neither the first source electrode nor the first insulating layer by the active layer.

According to an exemplary embodiment of the present disclosure, the anode is spaced apart from and thus in contact with none of the active layer, the first source electrode and the first insulating layer, by the gate insulating layer.

According to an exemplary embodiment of the present disclosure, the light emitting functional layer is spaced apart from and thus in contact with none of the active layer, the first source electrode and the first insulating layer, by both the anode and the gate insulating layer.

According to an exemplary embodiment of the present disclosure, the cathode covers the light emitting functional layer, and at least partially covers a portion of the active layer exposed from between the first insulating layer and the gate insulating layer and at least partially covers a portion of the first insulating layer exposed from the active layer.

According to an exemplary embodiment of the present disclosure, the gate insulating layer is spaced apart from and thus in contact with neither the second source electrode nor the second insulating layer, by the active layer.

According to an exemplary embodiment of the present disclosure, the anode is spaced apart from and thus is in contact with none of the active layer, the second source electrode and the second insulating layer, by the gate insulating layer.

According to an exemplary embodiment of the present disclosure, the light emitting functional layer is spaced apart from and thus in contact with none of the active layer, the second source electrode and the second insulating layer, by both the anode and the gate insulating layer.

According to an exemplary embodiment of the present disclosure, the cathode at least partially covers a portion of the active layer exposed from between the second insulating layer and the gate insulating layer and at least partially covers a portion of the second insulating layer exposed from the active layer.

According to an exemplary embodiment of the present disclosure, each of the first included angle value and the second included angle value ranges between 10° and 20°.

According to an exemplary embodiment of the present disclosure, each of the first included angle value and the second included angle value ranges between 70° and 90°.

According to an exemplary embodiment of the present disclosure, the anode is a transparent anode and the cathode is a reflective cathode.

According to an exemplary embodiment of the present disclosure, the active layer is formed by a photosensitive semiconductor material.

According to an exemplary embodiment of the present disclosure, the anode is a reflective anode and the cathode is a transparent cathode.

According to another aspect of the exemplary embodiment of the present disclosure, there is provided a method for preparing an OLED device comprising a substrate, comprising steps of: forming a first source electrode on the substrate, the first source electrode having a first side surface; forming a first insulating layer on the first source electrode, the first insulating layer having a second side surface intersecting with an upper surface of the first source electrode, and the second side surface also intersecting with the first side surface of the first source electrode, with at least one of an angle between the first side surface and the upper surface of the substrate and an angle between the second side surface and the upper surface of the substrate being an acute angle; forming an active layer on the substrate, the active layer covering the first side surface and the second side surface; forming a gate insulating layer on the active layer; forming an anode on the gate insulating layer; forming a light emitting functional layer on the anode; and forming a cathode on the light emitting functional layer, a portion of the cathode at least partially covering the first insulating layer and functioning as a first drain region which is in contact with the active layer.

According to an exemplary embodiment of the present disclosure, a second source electrode is formed simultaneously when the first source electrode is formed, the second source electrode and the first source electrode being in a same layer and spaced apart from each other, and the second source electrode having a third side surface opposite to the first side surface of the first source electrode; and a second insulating layer is formed simultaneously when the first insulating layer is formed, the second insulating layer being located on an upper surface of the second source electrode, and the second insulating layer and the first insulating layer being in a same layer and spaced apart from each other, and the second insulating layer having a fourth side surface opposite to the second side surface of the first insulating layer, with at least one of an angle between the third side surface and the upper surface of the substrate and an angle between the fourth side surface and the upper surface of the substrate being also an acute angle, and the active layer covering the third side surface and the fourth side surface; a portion of the cathode at least partially covering the second insulating layer and functioning as a second drain region which is in contact with the active layer.

According to an exemplary embodiment of the present disclosure, each of the angle between the first side surface and the upper surface of the substrate and the angle between the second side surface and the upper surface of the substrate is an acute angle, and each of the angle between the third side surface and the upper surface of the substrate and the angle between the fourth side surface and the upper surface of the substrate is also an acute angle;

the angle between the first side surface and the upper surface of the substrate and the angle between the third side surface and the upper surface of the substrate are the same as each other and equal to a first included angle value; and the angle between the second side surface and the upper surface of the substrate and the angle between the fourth side surface and the upper surface of the substrate are the same as each other and equal to a second included angle value.

BRIEF DESCRIPTION OF THE DRAWINGS

The drawings used by the embodiments of the present disclosure or the relevant art are briefly discussed herein for explaining the technical solutions in the embodiments or the relevant art more clearly. It is apparent that the accompanying drawings are merely some embodiments of the present disclosure. The skilled person in the art can obtain other drawings according to these drawings without any creative efforts.

DETAILED DESCRIPTION

Technical solutions of embodiments of the present disclosure will be described clearly and completely with reference to the drawings of the embodiments in the present disclosure. It is apparent that the described embodiments are only part of embodiments of the present disclosure, rather than all of the embodiments. On the basis of the embodiments of the present disclosure, all of other embodiments that can be obtained by the skilled person in the art without any creative efforts also belong to the scope of the present disclosure.

Respective dimension and shape of each component in the drawings are only intended to exemplarily illustrate the contents of the disclosure, rather than to demonstrate the practical dimension or proportion of components of an OLED device according to an embodiment of the disclosure.

According to a general technical concept of embodiments of the disclosure, in an aspect of embodiments of the disclosure, an OLED device is provided, as illustrated in FIGS. 1 to 10, comprising a substrate 10, and further comprising: a first source electrode 21 on a side of the substrate 10, the first source electrode 21 having a first side surface intersecting with the substrate at a first angle; a first insulating layer 31 on an upper surface of the first source electrode 21 facing away from the substrate 10, the first insulating layer 31 having a second side surface intersecting with the upper surface of the first source electrode 21 at a second angle, and the second side surface also intersecting with the first side surface of the first source electrode 21; an active layer 40 at a same side of the substrate 10 as the first source electrode 21 and the first insulating layer 31, the active layer 40 covering the first side surface and the second side surface; a gate insulating layer 50 on the active layer 40; an anode 60 on the gate insulating layer 50; a light emitting functional layer 70 on the anode 60; and a cathode 80 on the light emitting functional layer 70, a portion of the cathode 80 at least partially covering the first insulating layer 31 and functioning as a first drain region 81 which is in contact with the active layer 40. At least one of an angle between the first side surface of the first source electrode 21 and the substrate 10 and an angle between the second side surface of the first insulating layer 31 and the substrate 10 is an acute angle.

In embodiments of the disclosure, for example, the gate insulating layer 50 is spaced apart from both the first source electrode 21 and the first insulating layer 31, by the active layer, and thus in contact with neither the first source electrode 21 nor the first insulating layer 31.

In embodiments of the disclosure, for example, the anode 60 is spaced apart from the active layer 40, the first source electrode 21 and the first insulating layer 31, by the gate insulating layer 50, and thus in contact with none of the active layer 40, the first source electrode 21 and the first insulating layer 31.

In embodiments of the disclosure, for example, the light emitting functional layer 70 is spaced apart from the active layer 40, the first source electrode 21 and the first insulating layer 31, by both the anode 60 and the gate insulating layer 50, and thus in contact with none of the active layer 40, the first source electrode 21 and the first insulating layer 31.

In embodiments of the disclosure, for example, the cathode 80 covers the light emitting functional layer 70, and at least partially covers a portion of the active layer 40 exposed from between the first insulating layer 31 and the gate insulating layer 50, and at least partially covers a portion of the first insulating layer 31 exposed from the active layer 40.

Figure 1:
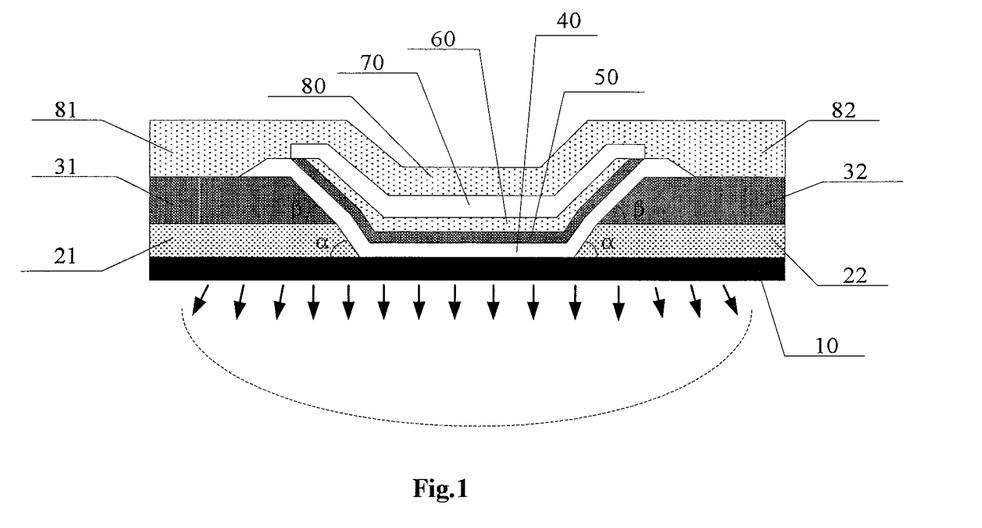
FIG. 1 illustrates a structural schematic view of an OLED device of a bottom-emission type according to embodiments of the disclosure.

The OLED device is for example a top-emission structure, or alternatively for example a bottom-emission structure, without being limited in embodiments of the disclosure; those skilled in the art may for example implement the OLED device as a type selected between these two types, by configuring different materials for manufacturing the anode 60 and the cathode 80. In an exemplary embodiment of the disclosure, as illustrated in FIG. 1, the OLED device is a bottom emission structure, i.e., the anode 60 is a transparent anode which is generally formed by an ITO material; and the cathode 80 is a reflective cathode which is generally formed by an aluminum metallic material. In another exemplary embodiment, as illustrated in FIG. 2, the OLED device is a top emission structure, i.e., the anode 60 is a reflective anode which for example comprises an aluminum metallic layer and an ITO layer provided on the aluminum metallic layer; and the cathode 80 is a transparent cathode which is generally formed by a barium metallic material or a silver metallic material.

Figure 2:
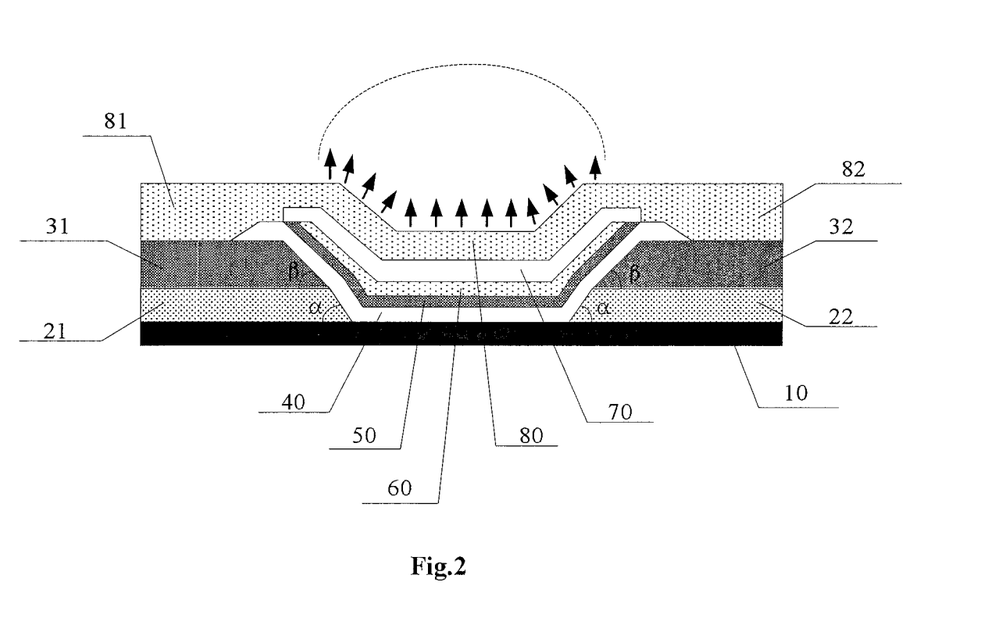
FIG. 2 illustrates a structural schematic view of an OLED device of a top-emission type according to embodiments of the disclosure.

As illustrated in FIGS. 1 and 2, the first source electrode 21 is provided on the substrate 10, i.e., as illustrated, a lower surface of the first source electrode 21 is located on the upper surface of the substrate 10 which is horizontally provided, by abutting closely against the upper surface of the substrate 10; and similarly, the first insulating layer 31 is in turn provided on the first source electrode 21, i.e., as illustrated, a lower surface of the first insulating layer 31 is located on the upper surface of the first source electrode 21 by abutting closely against the upper surface of the first source electrode 21. Based thereon, aforementioned limitation 'at least one of an angle between the first side surface of the first source electrode 21 and the substrate 10 and an angle between the second side surface of the first insulating layer 31 and the substrate 10 is an acute angle' for example specifically comprises three conditions as below:

In a first condition, an angle between the first side surface of the first source electrode 21 and the upper surface of the substrate 10 is an acute angle (i.e., the first side surface of the first source electrode 21 is provided obliquely with respect to the upper surface of the substrate 10, and the first angle between the first side surface of the first source electrode 21 and the lower surface of the first source electrode 21 or between the first side surface of the first source electrode 21 and the upper surface of the substrate 10 is an acute angle), an angle between the second side surface of the first insulating layer 31 and the upper surface of the substrate 10 is a right angle (i.e., the second side surface of the first insulating layer 31 is provided perpendicular to the upper surface of the substrate 10, the second side surface of the first insulating layer 31 is provided perpendicular to the lower surface of the first insulating layer 31 or the upper surface of the first source electrode 21, then the second angle is a right angle); or In a second condition, an angle between the second side surface of the first insulating layer 31 and the upper surface of the substrate 10 is an acute angle (i.e., the second side surface of the first insulating layer 31 is provided obliquely with respect to the upper surface of the substrate 10, and the second angle between the second side surface of the first insulating layer 31 and the lower surface of the first insulating layer 31 or between the second side surface of the first insulating layer 31 and the upper surface of the first source electrode 21 is an acute angle), an angle between the first side surface of the first source electrode 21 and the upper surface of the substrate 10 is a right angle (i.e., the first side surface of the first source electrode 21 is provided perpendicular to the upper surface of the substrate 10, the first side surface of the first source electrode 21 is provided perpendicular to the lower surface of the first source electrode 21, the first angle is a right angle); or In a third condition, each of the angle between the first side surface of the first source electrode 21 and the upper surface of the substrate 10 and the angle between the second side surface of the first insulating layer 31 and the upper surface of the substrate 10 is an acute angle (i.e., each of the first side surface of the first source electrode 21 and the second side surface of the first insulating layer 31 is provided obliquely with respect to the upper surface of the substrate 10, and the first angle between the first side surface of the first source electrode 21 and the lower surface of the first source electrode 21 or between the first side surface of the first source electrode 21 and the upper surface of the substrate 10 is an acute angle, and the second angle between the second side surface of the first insulating layer 31 and the lower surface of the first insulating layer 31 or between the second side surface of the first insulating layer 31 and the upper surface of the first source electrode 21 is also an acute angle, as illustrated), specifically referring to FIGS. 1 and 2.

The active layer 40 covers the first side surface and the second side surface, and is in contact with the first drain region 81, i.e., the active layer 40 connects with the first drain region 81 and the first source electrode 21; in other words, the active layer 40 connects with a drain electrode and a source electrode of a TFT; the anode 60 is provided on the gate insulating layer 50, i.e., the anode 60 functions as a gate electrode of the TFT. Thereby, a complete TFT structure of the OLED device is implemented. By controlling a voltage of the first source electrode 21, a control on a voltage of the cathode 80 (i.e., a control on a voltage of the drain electrode) is implemented, and then a control on the luminance of the OLED device is also implemented.

In practical application, by way of example, the light emitting functional layer 70 typically comprises a hole-transport layer HTL, a light-emitting layer EL, and an electron-transport layer ETL, and other functional layer(s) being auxiliary in implementing a light emitting functionality.

As such, as compared with a relevant art, in the OLED device according to embodiments of the disclosure, a 3D (three-dimensional) light source is formed, by providing the first insulating layer on the first source electrode and by setting at least one of an angle between the first side surface of the first source electrode and the upper surface of the substrate and an angle between the second side surface of the first insulating layer and the upper surface of the substrate to be an acute angle. And further, for example, by setting a magnitude of at least one of an angle between the first side surface of the first source electrode and the upper surface of the substrate and an angle between the second side surface of the first insulating layer and the upper surface of the substrate, such a 3D light source is constructed that it is similar to a 3D light source in a form of at least partially spherical shape, and it emits light rays having at least a portion of a spherical wave front and a relatively uniform light intensity in various directions, so as to enlarge the applicable range of the OLED device having the 3D light source as above. And moreover, in the OLED device according to embodiments of the disclosure, since the anode also functions as the gate electrode of the TFT, and the cathode also functions as the drain electrode of the TFT (i.e., it functions as the first drain region), therefore, when a proper voltage is applied on the first source electrode of the TFT, the TFT in which the active layer functions as its channel is at an operation condition; and since the portion of the cathode at least partially covering the first insulating layer functions as a first drain region, then it essentially means that the drain electrode of the TFT connects with the cathode of the OLED device; therefore, by controlling the voltage of the first source electrode, then the voltage of the cathode of the OLED device is simultaneously controlled, and the light emitting intensity of the OLED device is in turn controlled, such that the luminance of the OLED device is adjustable. As such, the applicable range of the OLED device is further enlarged.

Further, as illustrated in FIGS. 1 to 10, the OLED device for example further comprises: a second source electrode 22 at a same side of the substrate 10 as the first source electrode 21, the second source electrode 22 and the first source electrode 21 being in a same layer as each other and spaced apart from each other, and the second source electrode 22 having a third side surface opposite to the first side surface of the first source electrode 21, the third side surface intersecting with the substrate at a third angle; and a second insulating layer 32 on an upper surface of the second source electrode 22 facing away from the substrate 10, the second insulating layer 32 and the first insulating layer 31 being in a same layer as each other and spaced apart from each other, and the second insulating layer 32 having a fourth side surface opposite to the second side surface of the first insulating layer 31, the fourth side surface intersecting with the upper surface of the second source electrode 22 at a fourth angle, and the fourth side surface also intersecting with the third side surface of the second source electrode 22; the active layer 40 covering the third side surface and the fourth side surface; and a portion of the cathode 80 at least partially covering the second insulating layer 32 and functioning as a second drain region 82 which is in contact with the active layer 40. And at least one of the angle between the third side surface of the second source electrode 22 and the upper surface of the substrate 10 and the angle between the fourth side surface of the second insulating layer 32 and the upper surface of the substrate 10 is also an acute angle.

As such, the active layer 40 is arranged between the first source electrode 21 and the second source electrode 22 and extends between the first insulating layer 31 and the second insulating layer 32.

In embodiments of the disclosure, for example, the gate insulating layer 50 is spaced apart from both the second source electrode 22 and the second insulating layer 32, by the active layer 40, and thus in contact with neither the second source electrode 22 nor the second insulating layer 32.

In embodiments of the disclosure, for example, the anode 60 is spaced apart from the active layer 40, the second source electrode 22 and the second insulating layer 32, by the gate insulating layer 50, and thus is in contact with none of the active layer 40, the second source electrode 22 and the second insulating layer 32.

In embodiments of the disclosure, for example, the light emitting functional layer 70 is spaced apart from the active layer 40, the second source electrode 22 and the second insulating layer 32, by both the anode 60 and the gate insulating layer 50, and thus in contact with none of the active layer 40, the second source electrode 22 and the second insulating layer 32.

In embodiments of the disclosure, for example, the cathode 80 covers the light emitting functional layer 70, and at least partially covers a portion of the active layer 40 exposed from between the second insulating layer 22 and the gate insulating layer 50 and at least partially covers a portion of the second insulating layer 32 exposed from the active layer 40.

As illustrated in FIGS. 1 and 2, the second source electrode 22 is provided on the substrate 10, i.e., as illustrated, a lower surface of the second source electrode 22 is located on the upper surface of the substrate 10 which is horizontally provided, by abutting closely against the upper surface of the substrate 10; and similarly, the second insulating layer 32 is in turn provided on the second source electrode 22, i.e., as illustrated, a lower surface of the second insulating layer 32 is located on the upper surface of the second source electrode 22 by abutting closely against the upper surface of the second source electrode 22. Based thereon, aforementioned limitation 'at least one of the angle between the third side surface of the second source electrode 22 and the upper surface of the substrate 10 and the angle between the fourth side surface of the second insulating layer 32 and the upper surface of the substrate 10 is also an acute angle' for example specifically comprises three conditions as below:

In a first condition, an angle between the third side surface of the second source electrode 22 and the upper surface of the substrate 10 is an acute angle (i.e., the third side surface of the second source electrode 22 is provided obliquely with respect to the upper surface of the substrate 10, and the third angle between the third side surface of the second source electrode 22 and the lower surface of the second source electrode 22 or between the third side surface of the second source electrode 22 and the upper surface of the substrate 10 is an acute angle), an angle between the fourth side surface of the second insulating layer 32 and the upper surface of the substrate 10 is a right angle (i.e., the fourth side surface of the second insulating layer 32 is provided perpendicular to the upper surface of the substrate 10, the fourth side surface of the second insulating layer 32 is provided perpendicular to the lower surface of the second insulating layer 32 or the upper surface of the second source electrode 22, then the fourth angle is a right angle); or In a second condition, an angle between the fourth side surface of the second insulating layer 32 and the upper surface of the substrate 10 is an acute angle (i.e., the fourth side surface of the second insulating layer 32 is provided obliquely with respect to the upper surface of the substrate 10, and the fourth angle between the fourth side surface of the second insulating layer 32 and the lower surface of the second insulating layer 32 or between the fourth side surface of the second insulating layer 32 and the upper surface of the second source electrode 22 is an acute angle), an angle between the third side surface of the second source electrode 22 and the upper surface of the substrate 10 is a right angle (i.e., the third side surface of the second source electrode 22 is provided perpendicular to the upper surface of the substrate 10, the third side surface of the second source electrode 22 is provided perpendicular to the lower surface of the second source electrode 22, the third angle is a right angle); or In a third condition, each of the angle between the third side surface of the second source electrode 22 and the upper surface of the substrate 10 and the angle between the fourth side surface of the second insulating layer 32 and the upper surface of the substrate 10 is an acute angle (i.e., each of the third side surface of the second source electrode 22 and the fourth side surface of the second insulating layer 32 is provided obliquely with respect to the upper surface of the substrate 10, and the third angle between the third side surface of the second source electrode 22 and the lower surface of the second source electrode 22 or between the third side surface of the second source electrode 22 and the upper surface of the substrate 10 is an acute angle, and the fourth angle between the fourth side surface of the second insulating layer 32 and the lower surface of the second insulating layer 32 or between the fourth side surface of the second insulating layer 32 and the upper surface of the second source electrode 22 is also an acute angle, as illustrated), specifically referring to FIGS. 1 and 2.

The active layer 40 covers the third side surface and the fourth side surface, and is in contact with the second drain region 82, i.e., the active layer 40 connects with the second drain region 82 and the second source electrode 22; in other words, the active layer 40 connects with a drain electrode and a source electrode of another TFT; the anode 60 is provided on the gate insulating layer 50, i.e., the anode 60 functions as a gate electrode of said another TFT simultaneously. Thereby, two complete TFT structures of the OLED device are implemented. By controlling respective voltages of the first source electrode 21 and the second source electrode 22, a control on the voltage of the cathode 80 is implemented, and then a control on the luminance of the OLED device is also implemented.

In order to prepare a 3D light source which has a more uniform light intensity in various directions and a higher luminance, as illustrated in FIGS. 1 and 2, each of the angle between the first side surface and the upper surface of the substrate 10 and the angle between the second side surface and the upper surface of the substrate 10 is typically set as an acute angle, and each of the angle between the third side surface and the upper surface of the substrate 10 and the angle between the fourth side surface and the upper surface of the substrate 10 is also typically set as an acute angle; and moreover, the first angle between the first side surface and the upper surface of the substrate 10 and the third angle between the third side surface and the upper surface of the substrate 10 are the same as each other and equal to a first included angle value $\alpha$; and the second angle between the second side surface and the upper surface of the substrate 10 and the fourth angle between the fourth side surface and the upper surface of the substrate 10 are the same as each other and equal to a second included angle value $\beta$.

In embodiments of the disclosure, specific magnitudes of the first included angle value $\alpha$ and the second included angle value $\beta$ are not specially limited, and those skilled in the art may for example set theses magnitudes depending on practical requirements. It should be noticed that, in practical application, for example, specific direction and angle of the light emitted from the OLED device may be controlled by adjusting the magnitudes of the first included angle value $\alpha$ and the second included angle value $\beta$. Specifically, by way of example, as illustrated, two TFTs cooperate with each other, and in a condition that the first included angle value $\alpha$ and the second included angle value $\beta$ are relatively small, then an adjustable 3D light source (Lambertian-like light source or approximate Lambertian light source) which has a relatively uniform light intensity distributed in various directions from an approximate hemisphere. And in such a structure, exemplarily, for example, each of the first included angle value $\alpha$ and the second included angle value $\beta$ ranges between 10° and 20°. Alternatively, for example, as illustrated, two TFTs cooperate with each other, and in a condition that the first included angle value $\alpha$ and the second included angle value $\beta$ are relatively large, then in the top emission structure for example as illustrated in FIG. 2, by a mutual reflection between side walls of the anode 60, then, under an equivalent voltage level, a display light source having a ultra-high luminance may be obtained and a relatively concentrated light beam may be emitted therefrom, even without collimation. And in such a structure, exemplarily, for example, each of the first included angle value $\alpha$ and the second included angle value $\beta$ ranges between 70° and 90°.

As illustrated in FIG. 1, in a bottom emission structure, the active layer 40 is for example formed by a photosensitive semiconductor material. The active layer 40 is provided as a photosensitive semiconductor, and when the OLED device emits light, the light being incident on the active layer 40 may enhance current transmission of the TFT or TFTs; and the enhanced current may be further fed into the cathode 80 of the OLED device, which may further enhance light emission of the OLED device, and then the current transmission of the TFT or TFTs may in turn be further enhanced by the enhanced light, and next the cathode 80 is influenced thereby, and a mutual gain is implemented between the active layer 40 and the cathode 80, in other words, a gain is implemented at each one of the active layer 40 and the cathode 80 due to the other one of the active layer 40 and the cathode 80; e.g., a positive feedback is implemented. As such, it facilitates a light source having a relatively high luminance to be implemented by the OLED device operating at a relatively low operational voltage, decreasing a power consumption thereof.

In embodiments of the disclosure, a specific type of the photosensitive semiconductor is not defined; by way of example, the photosensitive semiconductor is for example Poly 3 hexylthiophene (P3HT), Pentacene, D-A conjugated polymer PBIBDF or Poly 3,3'''-docosyltetrathenethiophene (PQT-12) or the like.

Figure 3:
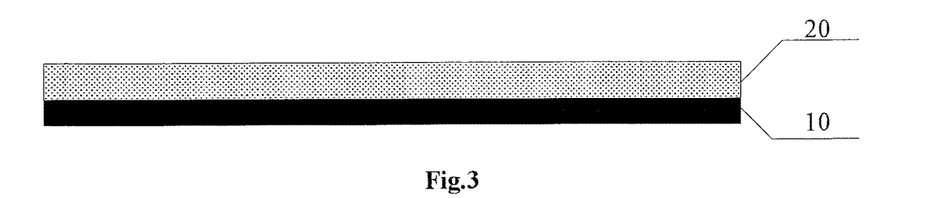
FIG. 3 illustrates a first structural schematic view of the OLED device according to embodiments of the disclosure.
Figure 4:
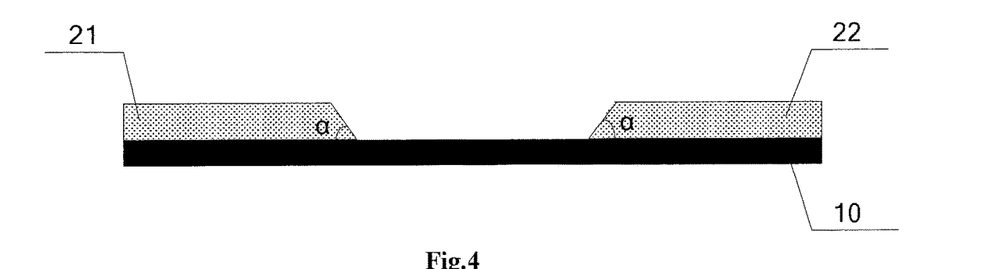
FIG. 4 illustrates a second structural schematic view of the OLED device according to embodiments of the disclosure.
Figure 5:
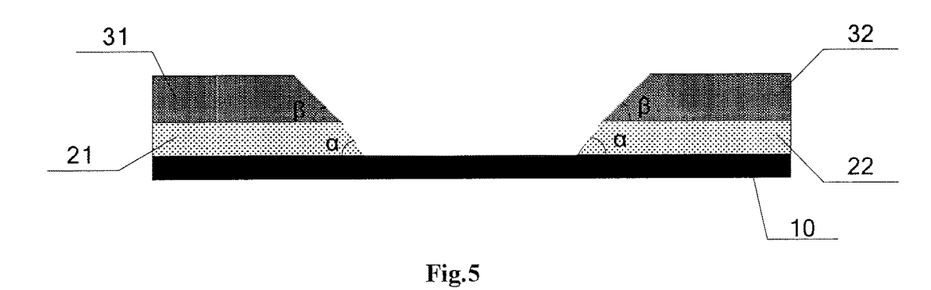
FIG. 5 illustrates a third structural schematic view of the OLED device according to embodiments of the disclosure.
Figure 6:
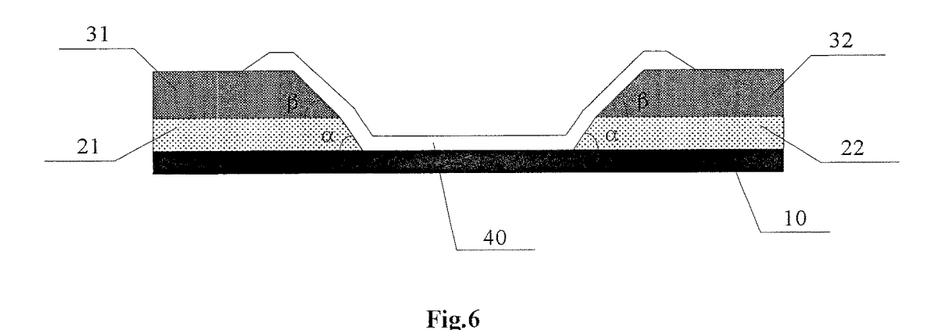
FIG. 6 illustrates a fourth structural schematic view of the OLED device according to embodiments of the disclosure.
Figure 7:
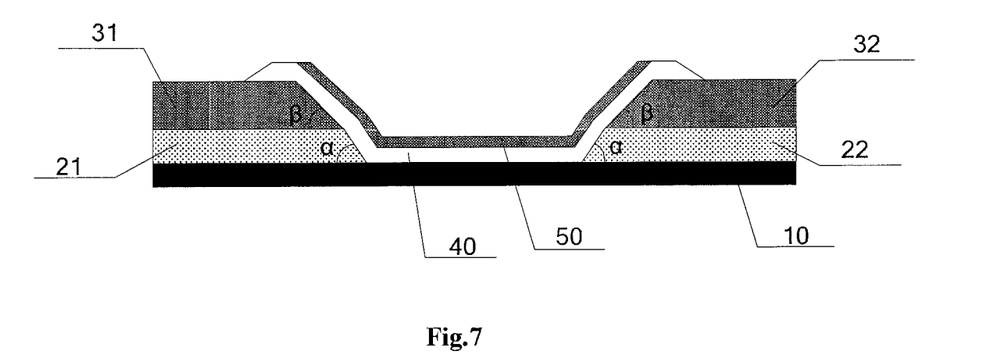
FIG. 7 illustrates a fifth structural schematic view of the OLED device according to embodiments of the disclosure.
Figure 8:
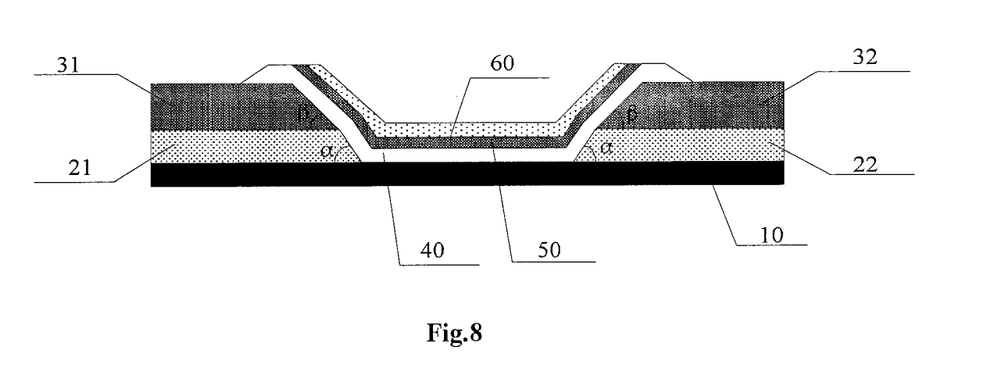
FIG. 8 illustrates a sixth structural schematic view of the OLED device according to embodiments of the disclosure.
Figure 9:
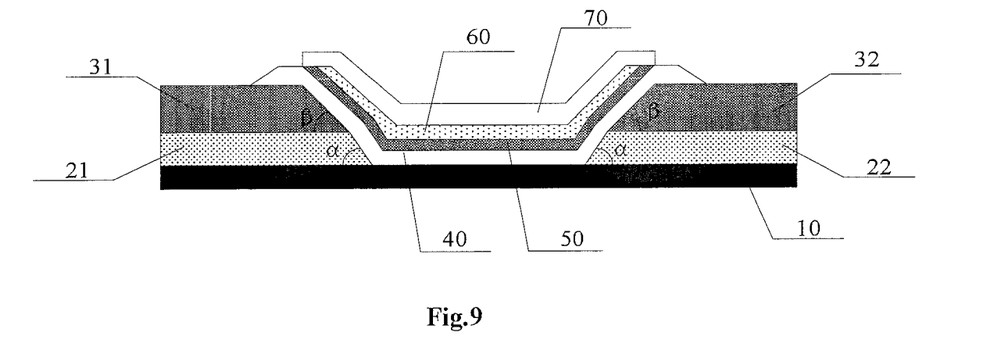
FIG. 9 illustrates a seventh structural schematic view of the OLED device according to embodiments of the disclosure.
Figure 10:
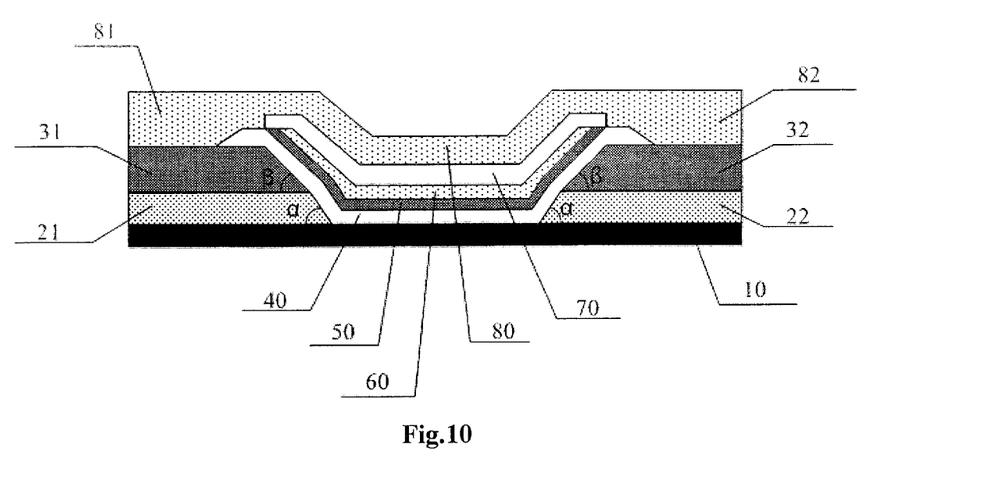
FIG. 10 illustrates a eighth structural schematic view of the OLED device according to embodiments of the disclosure.

By way of example, a specific exemplary preparation process of the OLED device having the bottom emission structure according to embodiments of the disclosure is set forth as below. Herein, in the OLED device having aforementioned two TFTs simultaneously, layers having equivalent properties of these two TFTs are provided in a same layer; as used herein, the term "(provided in a) same layer" refers to the relationship between the layers simultaneously formed in the same step. The term "same layer" does not always mean that the thickness of the layer or the height of the layer in a cross-sectional view is the same. Specific preparation process thereof is for example set forth as follows:

In a first step, the first source electrode 21 and the second source electrode 22 are formed, by transferring a graphene layer 20 on the substrate 10, for example as illustrated in FIG. 3, then the graphene layer 20 is patterned by a dry etching process applied thereon, each of the angle between the first side surface of the first source electrode 21 and the upper surface of the substrate 10 and the angle between the third side surface of the second source electrode 22 and the upper surface of the substrate 10 being the first included angle value α, for example as illustrated in FIG. 4;

In a second step, the first insulating layer 31 and the second insulating layer 32 are formed, by preparing an insulating layer of silicon dioxide above the substrate 10, and then by processing the insulating layer of silicon dioxide with a dry etching process applied thereon, each of the angle between the second side surface of the first insulating layer 31 and the upper surface of the substrate 10 and the angle between the fourth side surface of the second insulating layer 32 and the upper surface of the substrate 10 being the second included angle value β, for example as illustrated in FIG. 5;

In a third step, the active layer 40 is manufactured above the substrate 10, for example as illustrated in FIG. 6;

In a fourth step, the gate insulating layer 50 is formed, by depositing a silicon dioxide layer on the active layer 40, and in turn by performing patterning on the silicon dioxide layer, for example as illustrated in FIG. 7;

In a fifth step, on the gate insulating layer 50, an ITO material layer is deposited, to function as the anode 60, for example as illustrated in FIG. 8;

In a sixth step, the light emitting functional layer 70 is prepared on the anode 60, for example as illustrated in FIG. 9;

In a seventh step, the cathode 80 is formed by preparing an aluminum metallic layer on the light emitting functional layer 70, the cathode 80 being provided with the first drain region 81 and the second drain region 82, for example as illustrated in FIG. 10.

Once above steps are completed, then, on the basis of the finalized structure as prepared, after appropriate voltages are provided to the first source electrode 21, the second source electrode 22 and the anode 60, then a bottom light emission by the OLED device is implemented, specifically as illustrated in FIG. 1.

The OLED device according to embodiments of the disclosure may for example be applied to products of various fields, exemplarily, the OLED device of embodiments of the disclosure may for example be prepared as a 3D light source device having properties such as flexibility, ultra slim thickness, light weight and the like so as to be applied to products in various fields, such as: a display illumination system with wearable electronic device, an intelligent medical illumination system (e.g., surgical room illumination scene and the like), and intelligent display system (e.g., scenarios such as a display light source, high-luminance display pixels, and the like), an intelligent on-board system (e.g., scenarios such as car illumination, night lights, and the like), an artificial intelligence (e.g., scenarios such as an enriched robot function, and the like), a smart plant factory (e.g., scenarios such as a simulated solar illumination system, and the like) and the like.

Figure 11:
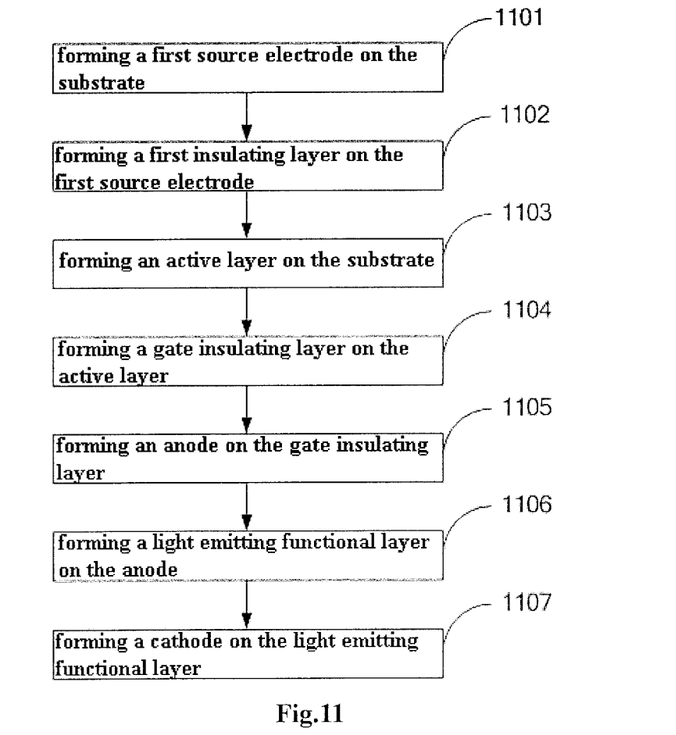
FIG. 11 illustrates a flow chart of a method of preparing the OLED device according to embodiments of the disclosure.

In another aspect of embodiments of the disclosure, based on the inventive concept of aforementioned embodiments, a method of preparing an OLED device is also provided according to embodiments of the disclosure. As illustrated in FIG. 11, the OLED device comprises a substrate, the method specifically comprising following steps:

Step 1101: forming a first source electrode 21 on the substrate 10, the first source electrode 21 having a first side surface; for example as illustrated in FIG. 4;

Step 1102: forming a first insulating layer 31 on the first source electrode 21, the first insulating layer 31 having a second side surface intersecting with an upper surface of the first source electrode 21, and the second side surface also intersecting with the first side surface of the first source electrode 21, with at least one of an angle between the first side surface of the first source electrode 21 and the upper surface of the substrate 10 and an angle between the second side surface of the first insulating layer 31 and the upper surface of the substrate 10 being an acute angle; for example as illustrated in FIG. 5.

Step 1103: forming an active layer 40 on the substrate 10, the active layer 40 covering the first side surface and the second side surface; for example as illustrated in FIG. 6.

Step 1104: forming a gate insulating layer 50 on the active layer 40; for example, as illustrated in FIG. 7.

Step 1105: forming an anode 60 on the gate insulating layer 50; for example as illustrated in FIG. 8.

Step 1106: forming a light emitting functional layer 70 on the anode 60; for example as illustrated in FIG. 9.

Step 1107: forming a cathode 80 on the light emitting functional layer 70, a portion of the cathode 80 at least partially covering the first insulating layer 31 and functioning as a first drain region 81 which is in contact with the active layer 40; for example as illustrated in FIG. 10.

Further, as illustrated in FIGS. 1 to 10, the method further comprising: forming a second source electrode 22 simultaneously while forming the first source electrode 21, the second source electrode 22 and the first source electrode 21 being in a same layer and spaced apart from each other, and the second source electrode 22 having a third side surface opposite to the first side surface of the first source electrode 21; and forming a second insulating layer 32 simultaneously while forming the first insulating layer 31, the second insulating layer 32 being located on an upper surface of the second source electrode 22, and the second insulating layer 32 and the first insulating layer 31 being in a same layer and spaced apart from each other, and the second insulating layer 32 having a fourth side surface opposite to the second side surface of the first insulating layer 31, with at least one of an angle between the third side surface of the second source electrode 22 and the upper surface of the substrate 10 and an angle between the fourth side surface of the second insulating layer 32 and the upper surface of the substrate 10 being also an acute angle, and the active layer 40 covering the third side surface and the fourth side surface; a portion of the cathode 80 at least partially covering the second insulating layer 32 and functioning as a second drain region 82 which is in contact with the active layer 40.

In order to prepare a 3D light source which has a more uniform light intensity in various directions and a higher luminance, as illustrated in FIGS. 1 and 2, each of the angle between the first side surface and the upper surface of the substrate 10 and the angle between the second side surface and the upper surface of the substrate 10 is typically set as an acute angle, and each of the angle between the third side surface and the upper surface of the substrate 10 and the angle between the fourth side surface and the upper surface of the substrate 10 is also typically set as an acute angle; and moreover, the angle between the first side surface and the upper surface of the substrate 10 and the angle between the third side surface and the upper surface of the substrate 10 are the same as each other and equal to a first included angle value α; and the angle between the second side surface and the upper surface of the substrate 10 and the angle between the fourth side surface and the upper surface of the substrate 10 are the same as each other and equal to a second included angle value β.

Various steps of the method of preparing the OLED device as above may for example refer to introductions to various layered structures in the OLED device as above, without repeating herein any more, and obtaining the same functionalities as the OLED device.

As compared with relevant art, on the basis of above technical solutions, the OLED device and the method of preparing the same according to embodiments of the disclosure at least have beneficial effects as below:

In the OLED device according to embodiments of the disclosure, a 3D (three-dimensional) light source is formed, by providing the first insulating layer on the first source electrode and by setting at least one of an angle between the first side surface of the first source electrode and the upper surface of the substrate and an angle between the second side surface of the first insulating layer and the upper surface of the substrate to be an acute angle. And further, for example, by setting a magnitude of at least one of an angle between the first side surface of the first source electrode and the upper surface of the substrate and an angle between the second side surface of the first insulating layer and the upper surface of the substrate, such a 3D light source is constructed that it is similar to a 3D light source in a form of at least partially spherical shape, and it emits light rays having at least a portion of a spherical wave front and a relatively uniform light intensity in various directions, so as to enlarge the applicable range of the OLED device having the 3D light source as above. And moreover, in the OLED device according to embodiments of the disclosure, since the anode also functions as the gate electrode of the TFT, and the cathode also functions as the drain electrode of the TFT (i.e., it functions as the first drain region), therefore, when a proper voltage is applied on the first source electrode of the TFT, the TFT in which the active layer functions as its channel is at an operation condition; and since the portion of the cathode at least partially covering the first insulating layer functions as a first drain region, then it essentially means that the drain electrode of the TFT connects with the cathode of the OLED device; therefore, by controlling the voltage of the first source electrode, then the voltage of the cathode of the OLED device is simultaneously controlled, and the light emitting intensity of the OLED device is in turn controlled, such that the luminance of the OLED device is adjustable. As such, the applicable range of the OLED device is further enlarged.

The above description only comprises the specific embodiments of the present disclosure, but the scope of the present disclosure is not limited thereto. Under the present disclosure, changes or modifications of embodiments of the disclosure which can be readily envisaged by those skilled in the art shall still fall within the scope of the present disclosure. Thus, the scope of present disclosure is defined by the claims and their equivalents.

What is claimed is:

1. An OLED device, comprising:
   a substrate;
   a first source electrode on a side of the substrate, the first source electrode having a first side surface intersecting with the substrate at a first angle;
   a first insulating layer on an upper surface of the first source electrode facing away from the substrate, the first insulating layer having a second side surface intersecting with an upper surface of the first source electrode at a second angle, and the second side surface also intersecting with the first side surface of the first source electrode;
   an active layer at a same side of the substrate as the first source electrode and the first insulating layer, the active layer covering the first side surface and the second side surface;
   a gate insulating layer on the active layer;
   an anode on the gate insulating layer;
   a light emitting functional layer on the anode; and
   a cathode on the light emitting functional layer, a portion of the cathode at least partially covering the first insulating layer and functioning as a first drain region which is in contact with the active layer,
   wherein at least one of an angle between the first side surface and the upper surface of the substrate and an angle between the second side surface and the upper surface of the substrate is an acute angle; and
   wherein the gate insulating layer is spaced apart from and thus in contact with neither the first source electrode nor the first insulating layer by the active layer.

2. The OLED device according to claim 1, further comprising:
   a second source electrode at a same side of the substrate as the first source electrode, the second source electrode and the first source electrode being in a same layer and spaced apart from each other, and the second source electrode having a third side surface opposite to the first side surface of the first source electrode, the third side surface intersecting with the substrate at a third angle; and a second insulating layer on an upper surface of the second source electrode facing away from the substrate, the second insulating layer and the first insulating layer being in a same layer and spaced apart from each other, and the second insulating layer having a fourth side surface opposite to the second side surface of the first insulating layer, the fourth side surface intersecting with the upper surface of the second source electrode at a fourth angle, and the fourth side surface also intersecting with the third side surface of the second source electrode;

wherein at least one of the angle between the third side surface and the upper surface of the substrate and the angle between the fourth side surface and the upper surface of the substrate is also an acute angle;

the active layer covers the third side surface and the fourth side surface; and a portion of the cathode at least partially covers the second insulating layer and functions as a second drain region which is in contact with the active layer.

3. The OLED device according to claim 2, wherein each of the angle between the first side surface and the upper surface of the substrate and the angle between the second side surface and the upper surface of the substrate is an acute angle, and each of the angle between the third side surface and the upper surface of the substrate and the angle between the fourth side surface and the upper surface of the substrate is also an acute angle;

the angle between the first side surface and the upper surface of the substrate and the angle between the third side surface and the upper surface of the substrate are the same as each other and equal to a first included angle value; and the angle between the second side surface and the upper surface of the substrate and the angle between the fourth side surface and the upper surface of the substrate are the same as each other and equal to a second included angle value.

4. The OLED device according to claim 1, wherein the anode is spaced apart from and thus in contact with none of the active layer, the first source electrode and the first insulating layer, by the gate insulating layer.

5. The OLED device according to claim 1, wherein the light emitting functional layer is spaced apart from and thus in contact with none of the active layer, the first source electrode and the first insulating layer, by both the anode and the gate insulating layer.

6. The OLED device according to claim 1, wherein the cathode covers the light emitting functional layer, and at least partially covers a portion of the active layer exposed from between the first insulating layer and the gate insulating layer and at least partially covers a portion of the first insulating layer exposed from the active layer.

7. The OLED device according to claim 2, wherein the gate insulating layer is spaced apart from and thus in contact with neither the second source electrode nor the second insulating layer, by the active layer.

8. The OLED device according to claim 2, wherein the anode is spaced apart from and thus is in contact with none of the active layer, the second source electrode and the second insulating layer, by the gate insulating layer.

9. The OLED device according to claim 2, wherein the light emitting functional layer is spaced apart from and thus in contact with none of the active layer, the second source electrode and the second insulating layer, by both the anode and the gate insulating layer.

10. The OLED device according to claim 2, wherein the cathode at least partially covers a portion of the active layer exposed from between the second insulating layer and the gate insulating layer and at least partially covers a portion of the second insulating layer exposed from the active layer.

11. The OLED device according to claim 3, wherein each of the first included angle value and the second included angle value ranges between 10° and 20°.

12. The OLED device according to claim 3, wherein each of the first included angle value and the second included angle value ranges between 70° and 90°.

13. The OLED device according to claim 1, wherein the anode is a transparent anode and the cathode is a reflective cathode.

14. The OLED device according to claim 13 wherein the active layer is formed by a photosensitive semiconductor material.

15. The OLED device according to claim 1, wherein the anode is a reflective anode and the cathode is a transparent cathode.

16. A method of preparing an OLED device, the OLED device comprising a substrate, the method comprising:

forming a first source electrode on the substrate, the first source electrode having a first side surface;

forming a first insulating layer on the first source electrode, the first insulating layer having a second side surface intersecting with an upper surface of the first source electrode, and the second side surface also intersecting with the first side surface of the first source electrode, with at least one of an angle between the first side surface and the upper surface of the substrate and an angle between the second side surface and the upper surface of the substrate being an acute angle;

forming an active layer on the substrate, the active layer covering the first side surface and the second side surface;

forming a gate insulating layer on the active layer;

forming an anode on the gate insulating layer;

forming a light emitting functional layer on the anode; and forming a cathode on the light emitting functional layer, a portion of the cathode at least partially covering the first insulating layer and functioning as a first drain region which is in contact with active layer, first source electrode nor the first insulating layer by the active layer.

17. The method according to claim 16, wherein a second source electrode is formed simultaneously when the first source electrode is formed, the second source electrode and the first source electrode being in a same layer and spaced apart from each other, and the second source electrode having a third side surface opposite to the first side surface of the first source electrode; and a second insulating layer is formed simultaneously when the first insulating layer is formed, the second insulating layer being located on an upper surface of the second source electrode, and the second insulating layer and the first insulating layer being in a same layer and spaced apart from each other, and the second insulating layer having a fourth side surface opposite to the second side surface of the first insulating layer, with at least one of an angle between the third side surface and the upper surface of the substrate and an angle between the fourth side surface and the upper surface of the substrate being also an acute angle, and the active layer covering the third side surface and the fourth side surface; a portion of the cathode at least partially covering the second insulating layer and functioning as a second drain region which is in contact with the active layer.

18. The method according to claim 17, wherein each of the angle between the first side surface and the upper surface of the substrate and the angle between the second side surface and the upper surface of the substrate is an acute angle, and each of the angle between the third side surface and the upper surface of the substrate and the angle between the fourth side surface and the upper surface of the substrate is also an acute angle;

the angle between the first side surface and the upper surface of the substrate and the angle between the third side surface and the upper surface of the substrate are the same as each other and equal to a first included angle value; and the angle between the second side surface and the upper surface of the substrate and the angle between the fourth side surface and the upper surface of the substrate are the same as each other and equal to a second included angle value.

\* \* \* \* \*